United States Patent [19]
Rise

[11] Patent Number: 5,195,430
[45] Date of Patent: Mar. 23, 1993

[54] DUAL ROLLER APPARATUS FOR PRESSURE FIXING SHEET MATERIAL

[75] Inventor: James D. Rise, Portland, Oreg.

[73] Assignee: Tektronix, Inc., Wilsonville, Oreg.

[21] Appl. No.: 796,095

[22] Filed: Nov. 21, 1991

Related U.S. Application Data

[63] Continuation-in-part of Ser. No. 357,382, May 24, 1989, Pat. No. 5,092,235.

[51] Int. Cl.⁵ .............................................. B30B 3/04
[52] U.S. Cl. ................................................. 100/168; 100/176; 355/295; 492/056
[58] Field of Search ........ 100/155 R, 162 B, 168–171, 100/176; 29/116.1, 116.2, 132; 355/282, 290, 295

[56] References Cited

U.S. PATENT DOCUMENTS

| | | | |
|---|---|---|---|
| 3,884,623 | 5/1975 | Slack | 100/176 X |
| 4,372,247 | 2/1983 | Calabrese | 100/176 X |
| 4,533,231 | 8/1985 | Shigenobu | 355/295 X |
| 4,594,068 | 6/1986 | Bardutzky et al. | 29/132 X |
| 4,864,343 | 9/1989 | Nelson | 100/162 B X |
| 4,884,501 | 12/1989 | Izaki et al. | 100/176 |
| 4,910,559 | 3/1990 | Kuge et al. | 355/282 X |
| 5,011,401 | 4/1991 | Sakurai et al. | 355/282 X |

FOREIGN PATENT DOCUMENTS

1158032  11/1963  Fed. Rep. of Germany ... 100/162 B

Primary Examiner—Harvey C. Hornsby
Assistant Examiner—Stephen F. Gerrity
Attorney, Agent, or Firm—John D. Winkelman; Ann W. Speckman

[57] ABSTRACT

A fixing and developing apparatus in which sheet material to be treated is passed through a high pressure nip defined by a pair of rollers. At least one of the rollers may have a composite construction. The composite roller includes an elongated tubular shell with a pressure applying external surface, an elongated core positioned within the tubular shell, and an elastomeric material disposed between the core and shell to support the shell on the core. The core may be of a number of configurations and may increase in transverse cross-sectional dimension from the respective ends of the core toward the center of the core. The core may taper continuously or in discrete steps from its center toward its first and second ends. In addition, the core may have a longitudinal cross section with a crown in the shape of a beam deflection curve for a simply supported, uniformly constant cross-section beam. The shell may be similarly configured along its interior surface. Also, the elastomer may be compressed at the center of the roller relative to the ends of the roller to preload its center portion.

8 Claims, 4 Drawing Sheets

DUAL ROLLER APPARATUS FOR PRESSURE FIXING SHEET MATERIAL

RELATED APPLICATION

This application is a continuation-in-part of application Ser. No. 07/357,382, filed May 24, 1989, now U.S. Pat. No. 5,092,235, issued Mar. 3, 1992.

BACKGROUND OF THE INVENTION

The present invention relates to a pressure fixing and developing apparatus in which ink containing sheet material to be treated is passed through a high pressure nip defined by a pair of rollers and is also directed to rollers for such apparatus.

It is known to pass sheet media on which an image is to be fixed or developed through a high pressure nip defined by a pair of rollers. Commonly, the outer ends of at least one of the two rollers is loaded with a pressure applying load applied in a direction normal to the longitudinal axis of the roller. This load also biases the rollers together to form the nip.

Application of a load in this manner results in bending moments in the loaded roller. The bending moments cause the roller to deflect or bow in the center such that there is a reduced or minimum fixing or developing pressure at the center of the nip. This deflection near the center of the roller increases when a sheet of media is inserted in the nip. As a result, uneven fixing of toners and ink to the media occurs over the surface area of the sheet. Higher pressures than necessary to fix or fuse toners and ink are required at the ends of the nip to assure adequate pressure fixing at the center of the nip.

There are devices in the prior art in which the rollers are skewed. That is, their longitudinal axes are supported out of parallel with one another, to compensate for the deflection of the fixing rollers. Skewing the rollers allows the ends of the rollers to wrap around each other as they deflect under load, resulting in more uniform pressure along the nip. However, skewing the rollers also results in forces which act on the media in a direction substantially perpendicular to the path the media travels. These lateral forces tend to crease or curl the media during passage through the nip. Also, skewed rollers are generally limited to pressure fixing at one pressure value. For example, higher pressures cause greater deflection in the rollers and require a greater skewing angle to avoid non-uniformity along the nip.

Other expedients have been introduced in an attempt to overcome the problem of deflection of fixing rollers upon the application of force to the ends of the rollers. Large diameter fixing rollers reduce, but do not eliminate, the deflection. However, large diameter fixing rollers add weight, cost and bulk to the apparatus. A backup roller or rollers in pressure contact with the pressure fixing and developing rollers has also been used to urge the pressure fixing rollers together along the nip. However, such backup roller systems require additional space and accessory components in comparison to dual roller systems.

Another method suggested in the prior art to compensate for the deflection due to loading is the use of a roller which is crowned at the center. However, crowned rollers have a faster surface velocity at their center than at their ends. This differential in surface velocity contributes to wrinkling of the media and limits the versatility of these devices in handling various types of substrates.

As a more specific example of the prior art, U.S. Pat. No. 4,363,862 of Giorgini discloses an apparatus for fixing toner powder images on sheet material. In Giorgini, a non-compliant pressure roller and compliant back up roller are supported on skewed longitudinal axes. The pressure roller is constructed from a rigid non-compliant material, such as steel, with an outer layer having an irregular surface comprising a plurality of randomly sized dome projections. Chrome is one example of this surface material. The backup roller is described as having a sheath of a compliant material over a central core. Organic polymeric substances are mentioned as suitable for the sheath, with nylon-66, glass filled nylon, hard rubber and acetal resins being specifically mentioned. The core of this backup roller is described as being of a rigid, non-compliant material.

U.S. Pat. No. 4,768,050 of Beery discloses a pair of pressure rollers used in conjunction with the "Mead" imaging process in which photosensitive micro capsules are ruptured by the rollers to provide the image. This apparatus includes a first roller having a hollow annular shell with an axially central part defining a loading region. A loading shaft extends through the shell and is joined to the shell only at the central loading region. The interior surface of the shell is partially tapered, and is described as controlling the deflection of the shell portion of the roller when the roller is loaded at its ends. The rollers define a working zone and are relieved at their ends to provide non-working regions. With this design, due to the excessive pressures at the ends of the rollers, the working zone must be less than the width of the rollers, as otherwise sheet material passing through the rollers can be damaged. Therefore, this apparatus lacks versatility in being able to effectively treat sheet material of varying widths.

U.S. Pat. No. 4,356,764 of Haugen discloses a pair of rollers, each including a central core of a uniform diameter and an outer hollow shell. Pressure transfer rollers support the shells on their respective cores with the transfer rollers engaging the supported shells at four spaced locations. Because the shell is supported at discrete locations by the transfer rollers, a less than uniform pressure would be expected along the nip. This is particularly expected to be the case when one of the outer cylindrical shells is made of an elastic material, such as rubber of about 35–60 durometer, as mentioned in one embodiment of this apparatus.

The use of pressure fixing rolls for fusing or spreading solidified hot melt ink on print media is also known. Japanese Patent No. 18,351 of Moriguchi, et al. and U.S. Pat. No. 4,745,420 of Gerstenmaier are two examples of these types of devices. The construction of pressure rollers is not described in detail in these two patents. The Gerstenmaier patent teaches an adjustable eccentric for varying the pressure applied to one of the rollers.

U.S. Pat. No. 4,889,761 discloses substrates printed with light-transmissive phase change inks that are processed by application of pressure, or by a combination of heat and pressure, in a dual roller assembly. Rollers having various constructions are disclosed, including a Teflon ®-coated heated roller constructed from aluminum tubing, and a silicone rubber covered pressure roller.

Several prior art references disclose specialized rollers for use in various environments. Canadian Patent No. 712,794, for example, discloses rolls for use in paper machines intended to produce webs of an even thickness and surface contour. The roller apparatus is designed to permit variations in the nip pressure, while maintaining even pressure along the length of the nip. Each roll comprises a rigid core and shell, with an elastic interlayer arranged between the core and the shell. The interlayer may comprise a plurality of layers of compressible rubber having varying elastic properties to permit selective indentation of the outer shell.

U.S. Pat. No. 4,253,392 teaches a roll fuser wherein one of the rolls comprises a thin outer shell having a variable taper producing a concave configuration under high humidity conditions and a generally cylindrical configuration under low humidity conditions. This is accomplished by axially adjusting end plugs supporting end portions of the normally concave roller. This roller design is intended to reduce wrinkling of copy paper under high humidity conditions.

U.S. Pat. No. 4,305,191 teaches an adjustable roller for squeezing liquid from cloth. The squeeze roller includes a support shaft supporting a cylindrical roller having an outer rubber layer. During application of pressure on the rubber cover, the central portion of the roller is subjected to a higher pressure than the opposite ends. Application of fluid pressure to movable support members provides a uniform pressure distribution over the length of the nip. This arrangement thus permits adjustment to vary the pressure along the nip, with the central portion subjected to a higher pressure than the opposite ends.

U.S. Pat. No. 4,372,247 teaches a dual roller fusing apparatus for fixing toner material to a copy sheet. The apparatus comprises a pair of parallel, cold pressure fixing rollers, each of the rollers having an outer cylindrical metal tube, an inner concentric shaft, and a cured elastomer occupying the volume between the tube and the shaft and bonded thereto. Force is applied to one of the two shafts to apply a uniform pressure to the nip.

Other examples of prior art image fixing apparatus including rollers are described in U.S. Pat. No. 3,293,059 of Stowell, U.S. Pat. No. 3,566,076 of Fantuzzo and U.S. Pat. No. 4,568,949 of Muranaka.

Prior art pressure fixing rolls known to the inventor are not satisfactory for treating different types of media having varying thicknesses and/or widths. Application of uniform pressure along the length of the nip is still problematic. Moreover, application of uniform pressure across the width of the substrate (i.e., the length of the nip) may result in wrinkling and dimensional distortion of the substrate.

SUMMARY OF THE INVENTION

In accordance with one aspect of the present invention, a roller for a fixing and developing apparatus in which sheet material to be treated is passed through a high pressure nip defined by a pair of rollers, comprises an elongated tubular shell with a pressure applying external surface, an elongated core positioned within the tubular shell, and an elastomeric material disposed between the core and shell. The elastomeric material supports the shell on the core. With this construction, the distribution of the load along the line of contact defining the nip can be controlled for particular applications. In one preferred embodiment, the load applied is controlled to be slightly higher at the center of the line. This construction minimizes the tendency for media to wrinkle, permitting processing of widely varying types of media, while providing substantially uniform pressure on the ink. The fixing and developing apparatus is especially suitable for fixing, i.e., fusing, substrates printed with phase change inks applied, for example, by ink jet printing techniques.

In accordance with another aspect of the present invention, the core has first and second ends, and also has an increasing cross sectional dimension moving from the respective ends of the core toward the center along the longitudinal axis. In a more specific embodiment of the invention, the core, in longitudinal cross section, has a crown in the shape of a beam deflection curve for a simply supported, uniformly loaded constant cross section beam. In an alternative embodiment, the core increases in cross sectional dimension in discrete steps moving from the ends of the core toward the center of the core. In a still further embodiment, the core may be tapered linearly from its center toward its first and second ends. Equivalently, the shell may be provided with a varying cross-section, being thicker at the center than at the ends in the same manner as the core varies in thickness. In each case, the load applied is slightly higher at the center of the roller.

The shell may be constructed from a rigid, non-compliant material, or from a moderately compliant material, such as a polymeric material. Typically, one roller forming the pressure fixing and developing apparatus has a rigid pressure applying surface, while the other roller has a moderately compliant pressure applying surface. This arrangement is particularly suitable for treating media printed with phase-change ink.

According to another aspect of the present invention, the elastomeric-filler disposed between the core and the shell preferably has a durometer of from about 30–60 Shore A and fills the space between the shell and core to provide continuous support for the shell, and thereby for the pressure applying surface. In one embodiment of the invention, the elastomeric-filler may be compressed at the center of the roller relative to the ends of the roller to preload the center portion of the roller.

It is preferable that the rollers defining the nip are oriented with their longitudinal axes parallel to one another. Both rollers may be of a construction which includes a shell and a core, with elastomeric material disposed between the core and shell. It has also been found, however, that improved pressure fusing results may be achieved when only one of the rollers of this composite design is included in the apparatus.

It is therefore an object of the present invention to provide an improved fixing and developing apparatus in which sheet material to be treated is passed through a high pressure nip defined by a pair of rollers.

It is another object of the present invention to provide an improved roller for such an apparatus.

It is a further object of the present invention to provide an apparatus capable of treating a wide variety of media, such as transparencies, envelopes, papers of various types and weights and thicknesses, including onion skin to eighty pound card stock and higher, plain and coated papers, drafting vellum, and so forth, without damaging the media.

Another object of the present invention is to provide such an apparatus which can compress phase change ink which has been solidified on media, whether the ink is present in a single layer, multiple layers, or a combination of such single and multiple layers.

Still another object of the present invention is to provide a fixing apparatus capable of applying the desired pressure to the media independent of the media thickness, the width of the media, and the thickness of ink on the media.

A further object of the present invention is to provide an apparatus in which the pressure or load applied to the media at the center of the nip is somewhat higher than the pressure applied to the media at the ends of the nip.

These and other objects, features and advantages of the present invention will become apparent with reference to the following description and drawings.

DETAILED DESCRIPTION OF PREFERRED EMBODIMENTS

In general, the present invention comprises a fixing and developing apparatus in which sheet material to be treated is passed through a high pressure nip defined by a pair of rollers and to a roller for such an apparatus. The apparatus has applicability to the fixing of toner powders on media, to "Mead" process applications in which photosensitive microcapsules are ruptured by passing one or more sheets containing such capsules between rollers, and to other applications in which pressure is used to process, fix, fuse or develop images on media.

The invention has particular applicability to the fixing of images formed by phase change ink droplets solidified on various types of substrates. In many cases, particularly in color printing applications using subtractive color mixing techniques, both single and multiple layers of ink are applied to the substrate to provide primary and secondary colors, respectively. To produce a high quality image, it is desirable to apply substantially uniform pressure to areas of the substrate containing both multiple layers and single layers of ink droplets. The rollers and pressure fixing apparatus of the present invention accomplish the desired fixing of solidified phase change ink droplets even under these circumstances. For purposes of convenience, and without limiting the broad applicability of the present invention to image fixing and developing apparatus in general, much of the following description is directed toward the use of the apparatus in fixing solidified phase change ink droplets on substrates.

Figure 1:
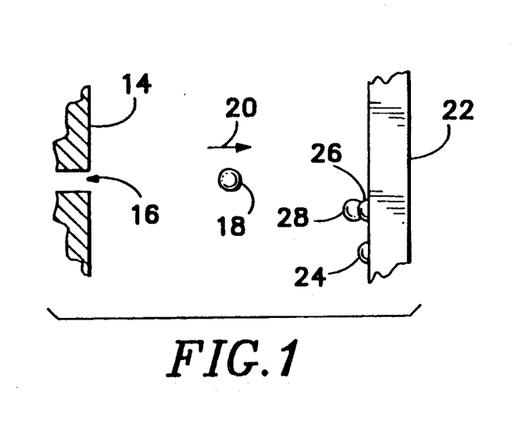
FIG. 1 is a schematic representation of an ink jet apparatus for jetting hot melt or phase change ink onto media.

Referring to FIG. 1, a printer has an ink jet print head 14 including an ink drop ejection orifice 16 from which ink drops, one being indicated at 18, are ejected in the direction of arrow 20 toward a substrate sheet 22. The ink jet print head 14 may take any form and may be of the drop-on-demand type, wherein droplets are only ejected in response to the state of energization of an associated transducer. Ink jet 14 may also be of the continuous type and may optionally be provided with an air assist for accelerating the delivery of ink drops toward the substrate. One suitable ink jet print head is described in U.S. Pat. No. 4,727,378 to Le et al.

In the case of phase change inks, solidified ink is heated to a liquid state and ejected from the orifice 16. Ink drops 24, 26 and 28 are shown in FIG. 1 following their deposition on the target or substrate 22. Droplets 24, 26 and 28, as well as other ink droplets on the substrate, undergo a liquid to solid phase transition upon contacting the substrate. The ink droplets project somewhat from the surface of the substrate, the degree of projection being exaggerated in FIG. 1. Certain types of non-porous substrates, such as transparencies, are not significantly penetrated by the printed ink droplets. As a result, for such non-porous substrate, the droplets tend to project to a greater degree than from other types of more porous media, such as plain paper.

In subtractive color mixing systems, secondary colors (red, green, and blue) are provided by superimposing ink droplets of two primary colors on top of one another. In the case of substrates printed with phase change inks, this results in surface areas having different thicknesses of ink, as represented by the superimposed ink droplets 26, 28 shown in FIG. 1, contrasted with the thickness of the single layer of ink represented by droplet 24. It is desirable, in any pressure fixing application, that sufficient fixing pressure be applied to the ink on the substrate, notwithstanding the different thicknesses of the ink layers.

Figure 2:
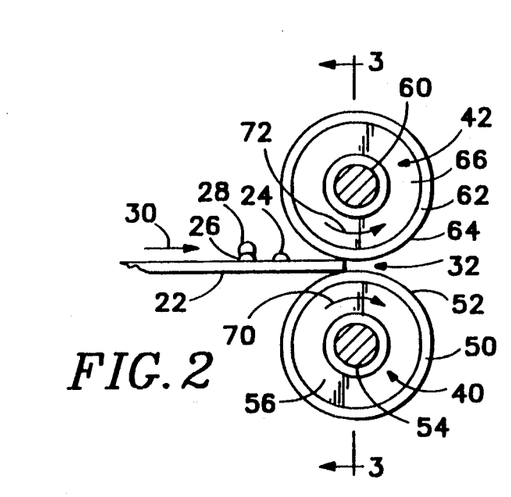
FIG. 2 is an end view, partially in section, and taken along line 2—2 of FIG. 3, showing media entering the nip between a pair of rollers in accordance with the present invention.

In FIG. 2, the printed media 22 is shown traveling in the direction of arrow 30 toward a high pressure nip 32 defined between a pair of rollers 40, 42. Roller 40 includes an elongated outer tubular shell 50 which has an external pressure applying surface 52. The surface 52 is typically smooth and of a right cylindrical configuration. Although variations are possible, the illustrated shell 50 has a uniform thickness along its length. An elongated core 54 is positioned in and extends along the length of the shell 50. The core 54 and shell 50 are concentric with one another. That is, their respective longitudinal axes are coincident. An elastomeric material 56 is disposed between the core and shell, the elastomeric material supporting the shell on the core. Consequently, torque applied to the core 54 is transmitted by the elastomer 56 to the shell as the core and shell are coupled together by the elastomer. If one of the rollers 40 or 42 is steel and the other roller has the above-described composite core, elastomer and shell combination, and if only the steel roller is driven, then very little torque is transmitted through the elastomer.

Figure 3:
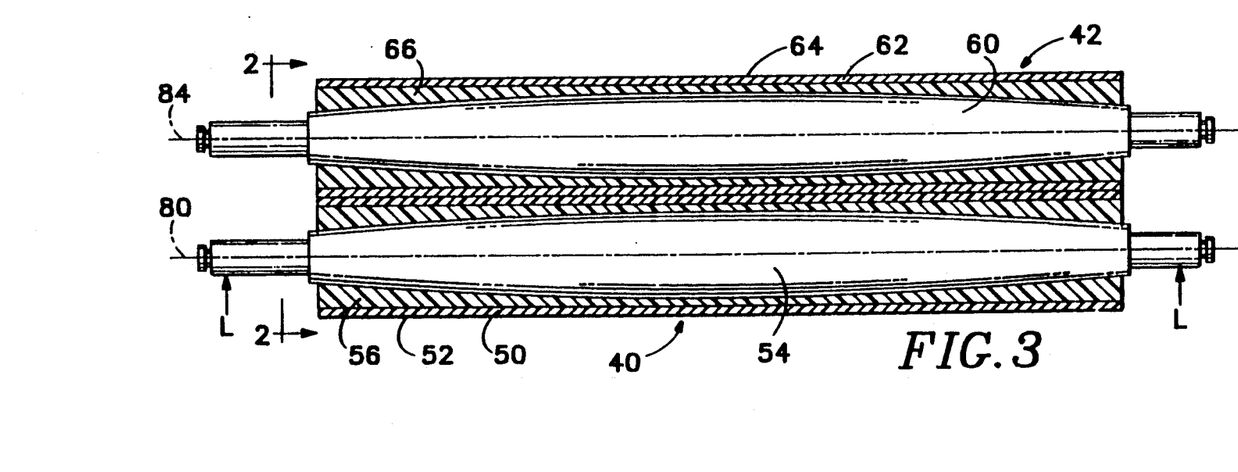
FIG. 3 is a side elevational view, partially in section, of the rollers of FIG. 2, taken along line 3—3 of FIG. 2.

The core 54 may be of a rigid, preferably non-compliant material such as steel. By leaving the surface of the core somewhat rough, for example following machining or casting, better adhesion to the elastomer is achieved. The elastomeric material 56 is compliant, and has a preferred durometer of between 30 and 60 Shore A, with a durometer of 35-45 Shore A being most preferred. As shown in FIG. 3, the elastomeric material fills the entire space between the core and shell so as to provide continuous support for the shell along the full length of the nip. The elastomeric material transfers both torque and pressure from the core to the shell and in effect performs like a low rate spring. One specific example of a suitable elastomer is REN:C:O-Thane, available from Ciba-Geigy Company.

In the embodiment illustrated in FIG. 2, the shell 52 is preferably of a moderately compliant material and most preferably is constructed from a polymeric material. Examples of suitable materials for the shell 52 include acetal homo polymer and nylon 6/6 from the E. I. DuPont Corporation. As explained below, the roller 40 having a compliant shell 52 has an enhanced capacity to effectively treat paper containing differing thicknesses of ink. At the same time, the pressure between the rollers 40, 42 is maintained across the length of the nip even though the thickness of the ink varies. In addition, the use of a compliant shell, again as explained more fully below, allows the roller to deform at the edge of the media to thereby minimize non-uniformity in the pressure applied near the edge of the media. Thus, the shell 52 is capable of conforming to the thickness of the media and ink on the media, and yet is hard enough to define a high pressure nip.

In FIG. 2, the roller 42 is also shown with a central core 60, an outer tubular shell 62 having an external pressure applying surface 64, and an elastomeric material 66 supporting the shell on the core. The roller 42 may be similar in construction to the roller 40. However, in a preferred form of the invention, the roller 42 may be solid steel or be provided with a shell 62 of a rigid, non-compliant material such as steel. As a specific example, shell 62 may be of a material having a Rockwell hardness from the high 50's to the mid 60's, with a Rockwell hardness of C-60 being one specific example.

The surface 64 of the shell 62 is finished in a conventional manner. The shell 62 may be chrome plated or otherwise treated in a conventional manner for corrosion resistance. Thus, roller 42 provides a hard surface against which the ink coated surface of sheet 22 passes between the nip 32. The roller 42 may be of a different diameter than the roller 40. For example, a relatively small diameter roller 42 may be used, without a backup roller. At the same time, shell 52 provides a compliant surface for receiving the media. The respective rollers 40, 42 are shown rotating in the direction of arrows 70, 72 to pass the media 22 through the nip 32. Typically, roll 42 is actively driven, while roll 40 is passively driven as a result of being in surface contact with roll 42. Of course, the rollers 40, 42 may be geared or otherwise coupled together for driving purposes, or they may be separately driven.

Referring to the embodiment illustrated in FIG. 3, each of the illustrated cores 54, 60 are identical and therefore only core 54 will be described. The core 54 may be hollow, but is typically solid with an increasing transverse cross-sectional dimension from the respective ends of the core to the center of the core. More specifically, the illustrated core 54 has been designed in longitudinal cross-section to have a crown in the shape of a beam deflection curve for a simply supported, uniformly loaded constant cross-section beam. Consequently, when the respective ends of the core 54 are loaded with a load L in a direction normal to the longitudinal axis 80 of the core, this configuration of the core assists in producing the desired load profile along the full length of the pressure nip.

In one specific example, provided to illustrate the compactness of the roller apparatus, the roller 40 may have an outer diameter of 1.74 inches and be approximately 12.3 inches long. The core is typically 0.8 inches at the ends of the core and 1.4 inches in diameter at the center of the core, with a 0.05 inch gap or space being provided between the core and shell at the center of the core. This gap, as well as the remaining space between the shell and core, is filled with the elastomeric material 56. When loaded with a load L, for example, a load sufficient to produce 85-100 lbs. per lineal inch along the nip, a pressure fixing and developing apparatus of this construction is useable to treat media along the full width of the nip. Therefore, in this specific example, media up to about 12.3 inches wide can be treated. At the same time, narrower media may also be treated with excellent results and without requiring the media to be centered between the ends of the rollers.

Also, with the construction shown in FIG. 3 and with the longitudinal axis 80 of roller 40 supported parallel to the longitudinal axis 84 of the roller 42, a slightly higher pressure is achieved between the rollers at the center of the nip than at the ends of the nip. This pressure can be decreased by decreasing the cross sectional dimension of the core at its center and increased by increasing the cross sectional dimension of the core at its center.

Although a uniform pressure across the full length of the nip has proven desirable for many applications, a design in which the nip pressure at the center of the rollers is slightly higher than at the ends of the rollers reduces wrinkling of the media. Preferably the pressure at the center of the rollers is from 1%-40% higher than the pressure at the ends of the rollers, with a 5% to 30% differential being most preferred, and a 15% differential being a specifically preferred pressure differential. Too great a pressure differential may result in formation of transverse wrinkles in the printed media.

Figures 4, 5, 6, 7, 10:
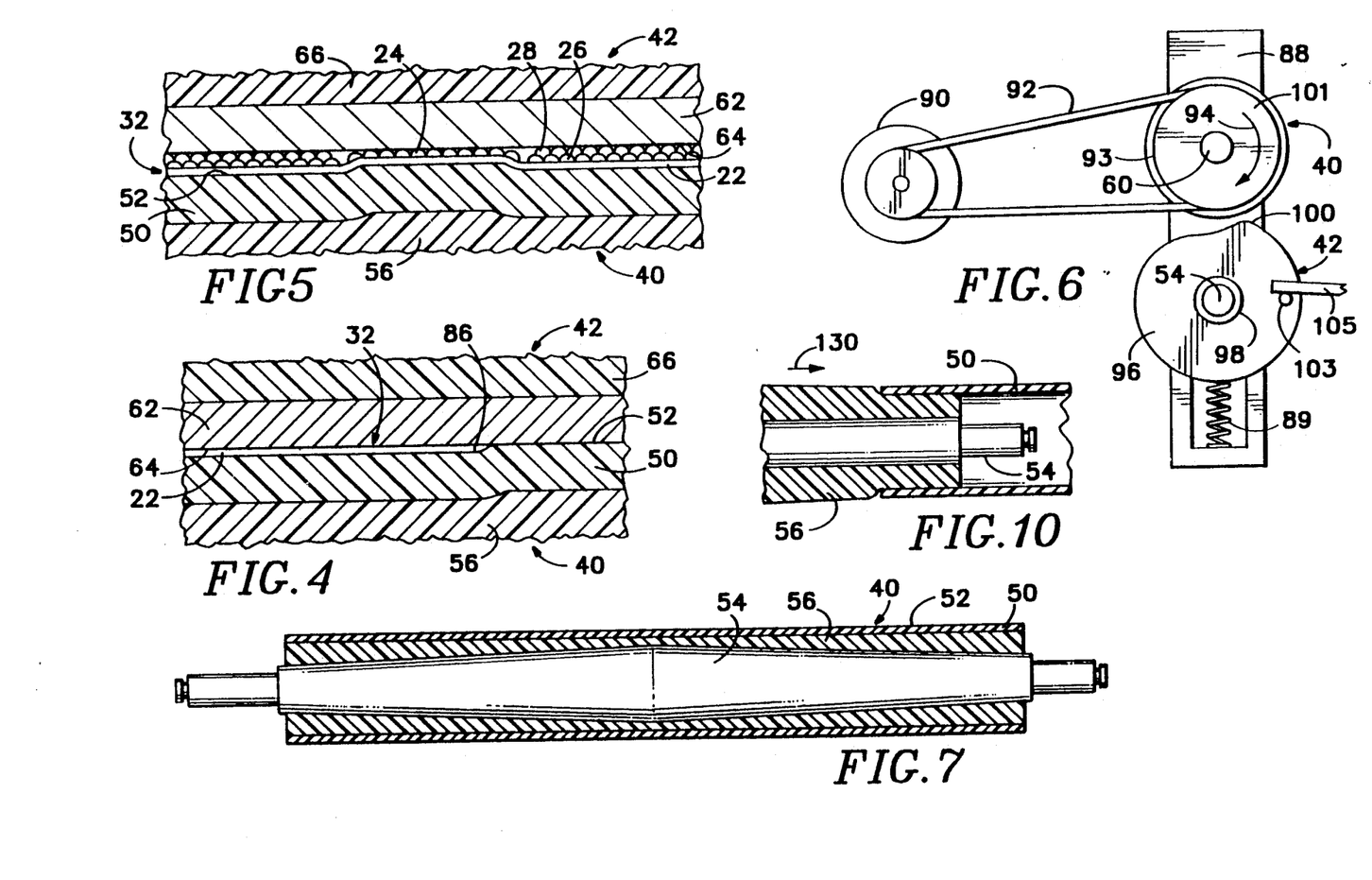
FIG. 4 is an enlarged sectional view of a portion of two rollers in accordance with the present invention showing the edge of a sheet of media passing between the rollers.
FIG. 5 is an enlarged view of two rollers in accordance with the present invention showing the treatment of media containing both single and multiple layers of ink.
FIG. 6 is a partial schematic illustration of one type of support, loading and drive mechanism for a roll type fixing and developing apparatus, which includes one or more rollers of the present invention.
FIG. 7 is a side elevational view, partially in section, showing another type of core for a roller of the invention.
FIG. 10 is a side elevational view, partially in section, of the core and elastomer assembly of FIG. 9 shown being inserted into a shell.

As shown in FIG. 4, as substrate 22 passes through the nip 32, the compliant shell 52 deforms to accommodate the edge 86 of the substrate 22. Consequently, high localized pressure is not produced at the edge of the sheet. High localized pressure would contribute to the wrinkling or tearing of the sheet as it passes between the rollers. It has been found that the apparatus of the present invention is usable to process media of varying widths and thicknesses. For example, envelopes, paper ranging in weight from onion skin to 80 pound stock, drafting vellum, transparency film and other media printed with hot melt ink have all been treated using the apparatus of the present invention.

Returning again to FIG. 3, the roller 42 may be replaced with a conventional roller, such as of solid steel or the like. In such a case, the benefits of the invention are still in large part achieved when a roller 40 of the FIG. 3 type is used in conjunction with the conventional roller. Again, load may be applied to one or both of the rollers but roller 42 preferably serves to provide the desired pressure profile.

With reference to FIG. 5, and to further illustrate the performance of the present invention, a substrate sheet 22 is shown with single and double layers of ink passing through the nip 32. Due to the compliance of the shell 42, virtually all of the media containing the single layer of ink (i.e., drop 24 being one example in this figure) and all of the area containing the multiple layers of ink (i.e., two such layers 26 and 28 being shown in this figure) are subjected to pressure by the pressure applying rollers 40, 42.

When pressure is applied to these ink drops, they tend to spread on the media. An increase in area covered by the dots of about 100 percent on transparencies is one specific illustration of these results. Consequently, higher quality color images are achieved, even where multiple layers of ink are being pressure treated simultaneously with the treatment of layers of ink of a lesser thickness.

With reference to FIG. 6, one means of supporting, driving and applying pressure to the pressure rollers 40 and 42 is shown. In FIG. 6, a steel roller 40, with a shaft 60, is shown above a roller 42, with the shell, core and elastomer. The ends of the core 54 and the ends of the shaft 60 are journaled to a frame 88 to thereby rotatably support the respective rollers 40, 42. Also, the ends of core 54 are carried by a sliding block portion of frame 88 so that the roller 42 can shift upwardly against the roller 40. The rollers are biased together at their respective ends by a spring or other biasing mechanism, one being shown at 89.

The roller 40 may be driven by a motor 90 and belt 92, coupled to a pulley 93 on shaft 60, in the direction of arrow 94. A cam 96 is pivotally mounted by a bushing 98 to the end of the core 54. This cam has a cam surface 100 and an outwardly projecting stop engagement pin 103. When roller 40 is driven in the direction of the arrow 94, the rollers 40, 42 engage one another and cam 96 rotates counterclockwise in FIG. 6 until pin 103 engages a frame mounted stop 105. In this case, the cam 96 is spaced from a cam element 101 keyed to shaft 60, the rollers 40, 42 are together, and pressure is applied across the nip by the outer surfaces of the rollers.

When the roller 40 is driven in the opposite direction from arrow 94, cam 96 is rotated clockwise as shown in FIG. 6, by the engaged rollers. As cam surface 100 engages the cam element 101, the elements 96, 101 shift the rollers 40, 42 apart and relieve the load from the pressure surfaces of the rollers. Typically, the pressure is relieved at times when the apparatus is not being used to treat substrates so that flat spots do not form on the outer surface of the shell of roller 42. Of course, other drive mechanisms and pressure applying mechanisms are also suitable.

With reference to FIG. 7, an alternative form of roller 40 is illustrated. In this figure, as well as in the remaining figures mentioned below, elements in common with the elements shown in FIG. 3 are assigned like numbers and will not be discussed in detail. In the FIG. 7 form of the invention, the core 54 has an increasing transverse cross-sectional dimension or diameter moving from the respective ends of the core toward the center of the core. However, in this case, the core is tapered linearly from the center of the core toward the respective ends of the core. With this construction, the pressure at the center of the roller will be somewhat higher than the pressure at the ends of the roller. In addition, the pressure distribution across the nip will drop off to a somewhat greater extent toward the ends of the roller than in the FIG. 3 embodiment.

Figures 8, 9:
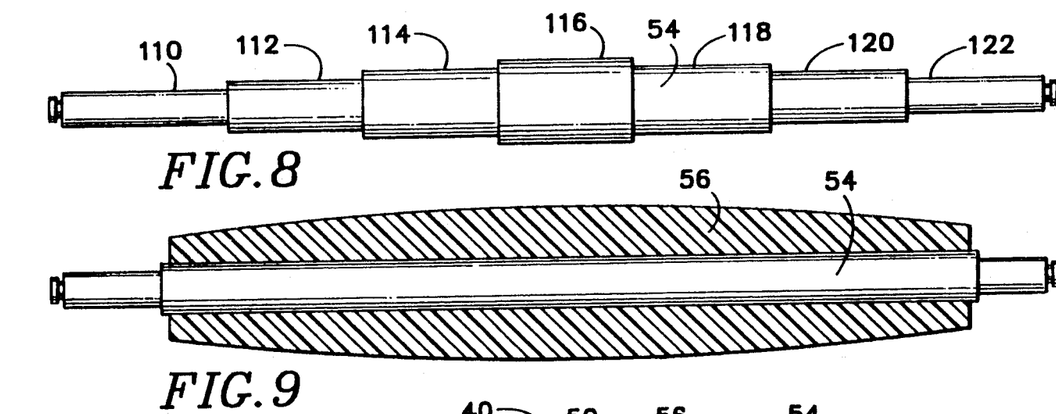
FIG. 8 is a side elevational view of another form of core for a roller of the present invention.
FIG. 9 is a side elevational view, partially in section, of a core with elastomer thereon configured to preload the elastomer at the center of a roller when the core and elastomer are combined with the shell.

In FIG. 8, the core 54 is shown with an outer surface having discrete steps 110, 112, 114, 116, 118, 120 and 122, rather than a continuously curved surface as shown in FIG. 3. Again, the transverse cross-sectional dimension of the core increases moving from the outer ends of the core toward the center of the core. At each step (i.e., 110–112) along the length of the core, some differential in nip pressure is expected at the surface of the shell in the region of the step. As the steps become smaller and more numerous, the core in effect performs as if it has no steps.

Figure 11:
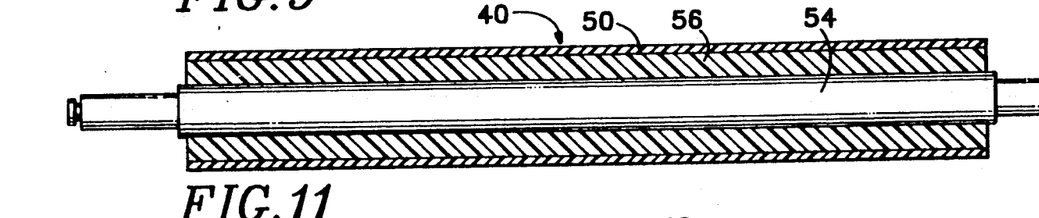
FIG. 11 is a side elevational view, partially in section, showing another form of roller in accordance with the present invention.

In FIG. 11, the core 54 is of a uniform cross-section with the shell 50 again being supported by elastomer 56 on the core. Although less desirable than the previously discussed constructions, the combination of a shell 50 supported by elastomer 56 on the core 54 does assist in producing favorable results in comparison to solid rollers. Also, a harder elastomer may be used at the center of the roller than at the ends of the roller to increase the pressure at the center of the rollers.

Figure 12:
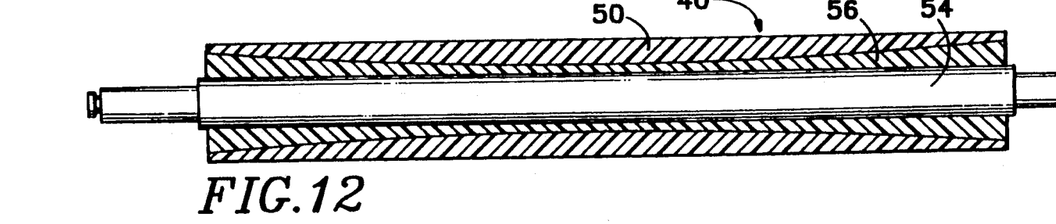
FIG. 12 is a side elevational view, partially in section, showing another form of roller in accordance with the present invention.

In FIG. 12, the thickness of the shell 50 is varied, with the shell being thicker at the center than the ends. In this case, the interior surface of the shell has a similar contour as the outer surface of the core 54 illustrated in FIG. 3. Again, the interior surface of the shell 54 may, in cross section, be in the shape of a beam deflection curve for a simply supported beam. Also, the shell may have its interior surface configured like the outer surface of the cores of the other examples. The resulting roller provides for application of pressure which is slightly higher at the center of the core than at the ends of the core.

FIGS. 9 and 10 illustrate an embodiment of the invention in which the elastomer 56 is formed on the core 54 with the elastomer increasing in cross-sectional dimension moving from the ends of the core toward the center of the core. In FIG. 9, the elastomer is shaped in longitudinal cross-section to have a crown similar to the crown of the core illustrated in FIG. 3. When, as shown in FIG. 10, the core and elastomer assembly is inserted (in direction of arrow 130) into the shell 50, the centermost portion of the elastomer is compressed to a higher degree than the elastomer near the ends of the roller. This makes the pressure applied slightly greater at the center than at the ends and reduces the tendency of various media to wrinkle.

In applications involving fixing of phase change ink printed on various substrates, the precise fixing pressure applied generally is not critical, provided that a threshold fixing pressure is exceeded. In the case of phase change inks of the type disclosed in U.S. Pat. No. 4,889,761, threshold pressures of about 3,000 psi are sufficient to satisfactorily fix printed substrates. Pressure variations along the length of the nip can therefore be used to control wrinkling and dimensional distortion of printed media as it is passed between the rollers.

The pressure profile along the length of the nip formed by opposed rollers influences wrinkling and dimensional distortion of printed media passed between rollers. In general, a uniform (constant) pressure profile tends to produce longitudinal wrinkling of the printed media. If the pressure applied near the midpoints of the rollers is substantially greater than that applied near the ends, transverse wrinkles tend to form in a direction generally perpendicular to the motion of the substrate through the nip. Conversely, substantially lower pressure near the midpoints compared to the ends of the rollers tends to produce longitudinal wrinkling in a direction generally parallel to the motion of the substrate through the nip.

Figure 13:
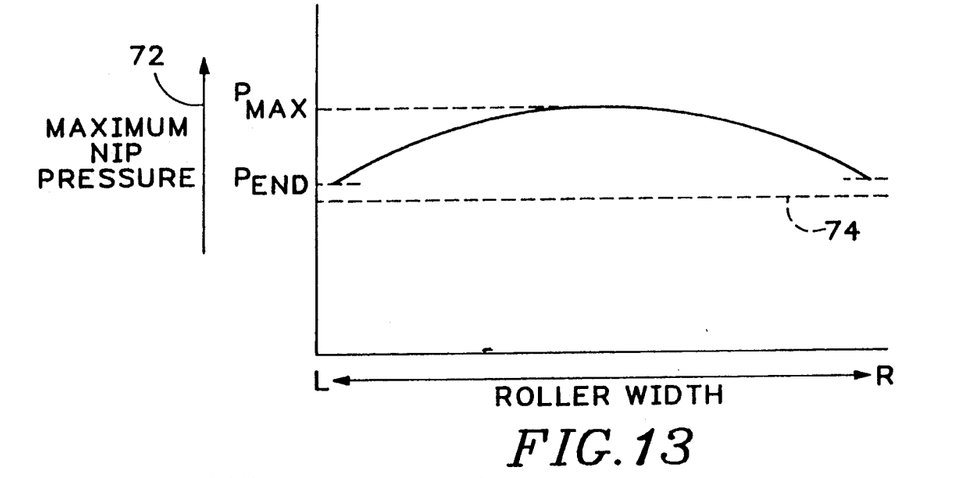
FIG. 13 schematically illustrates a preferred pressure profile for roller processing substrates printed with phase change ink.

FIG. 13 illustrates a preferred pressure profile for processing substrates printed with phase change ink in a dual roller fixing apparatus that provides satisfactory fusing of the printed media, yet reduces wrinkling during fusing. The x-axis of FIG. 13 represents the width of a roller from one journal end (L) to the other (R). The y-axis represents maximum nip pressure on a linear scale, with pressure increasing in the direction of arrow 72. Dashed line 74 represents the threshold pressure for satisfactory fixing. Curve 76 represents a desired pressure profile for providing satisfactory fixing results, while simultaneously reducing wrinkling and dimensional distortion of the media being processed. The maximum pressure at the midpoint of the roller ($P_{max}$) is preferably 5%-30%, and most preferably about 15% greater than the maximum pressure at the ends of the roller ($P_{end}$).

Several factors relating to the configuration and composition of the rollers affect the pressure profile of a roller assembly. According to an especially preferred embodiment illustrated in FIG. 14, the roller assembly includes two rollers having different properties. Drive roller 140 preferably comprises a rigid, cylindrical roller constructed, for example, of steel or another material having high stiffness and hardness. The outer surface of the drive roller is finished in a conventional manner to prevent corrosion, and is preferably coated with an anti-stick surface treatment such as a nickel/PTFE (polytetrafloroethylene) matrix. Roller 140 preferably has a solid construction, as shown, but it may be of a hollow construction, provided it has the requisite stiffness and hardness. Roller diameters of about 1 to 2 inches are preferred, with a diameter of about 1.45 inches being especially preferred. Suitable mounting means are described below in connection with the opposed composite roller.

Figure 14:
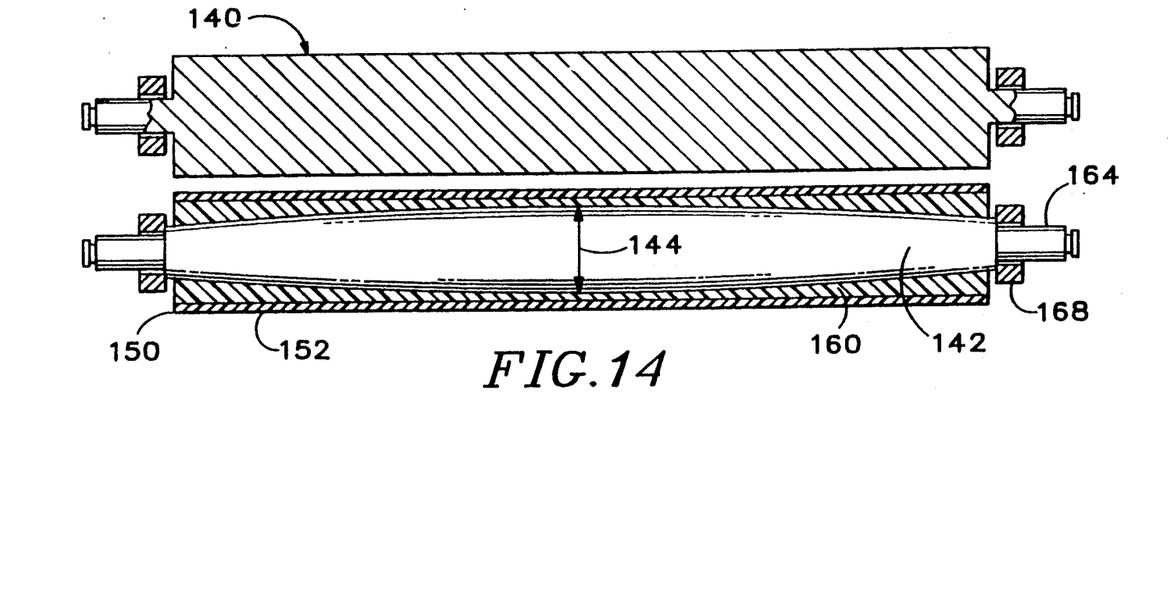
FIG. 14 illustrates a side elevational view, partially in section, of a preferred configuration for a dual roller pressure fixing apparatus in accordance with the present invention.

The opposing roller preferably has a composite configuration generally as described above, with a rigid core, a somewhat compliant shell, and elastomeric material filling the void between the core and the shell. The two rollers comprising the dual roller apparatus are preferably aligned on substantially parallel longitudinal axes. Substantially parallel in this context means that the longitudinal axes of the rollers do not deviate more than about 2° from parallel.

With reference to FIG. 14, core 142 has a generally curved configuration and tapers symmetrically from its midpoint toward both ends. In general, flatter core configurations produce flatter pressure profiles, while cores having a steeper configuration result in steeper pressure profiles. Core 142 preferably comprises a rigid material such as steel, and may be constructed in a solid or hollow form. The diameter of core 14 at its midpoint 144 is preferably from about 1.1 about 1.45 inches, with a diameter of about 1.34 inches being especially preferred. The diameter at core 142 at its endpoints is preferably from about 0.7 to 1.0 inch, with a diameter of about 0.80 inch being especially preferred. An especially preferred configuration for core 142 is expressed mathematically as the diameter (D) of the core at a distance (x, in inches) from one end point of the roller in accordance with the following equation:

$$D(x) = 0.8 + [(0.0686)x - (0.000866)x^3 + (3.44 \times 10^{-5})x^4].$$

Shell 150 may have a generally cylindrical configuration, but its outer, pressure application surface preferably has a slight concave configuration. As viewed in FIG. 14, pressure application surface 152 of shell 150 preferably has a radius of curvature of from about 1500 to 4000 inches, and most preferably about 2600 inches. The thickness of shell 150 is preferably from about 0.07 to about 0.2 inches at its ends, with a thickness of about 0.09 inches being preferred. The thickness of shell 150 is preferably about 3% to about 20% the thickness of the central portion of core 142.

Shell 150 preferably comprises a material that is somewhat compliant, yet is rigid enough to provide application of pressures in excess of the threshold pressure values along the nip. Additionally, materials that are abrasion resistant and bond to the elastomeric filler are preferred. Materials having a flexural modulus of elasticity (at 73° F.) of from about 150,000 to about 700,000 psi and a Rockwell (R) hardness (at 73° F.) of about R-40 to about R-130 are preferred. An especially preferred material is unfilled, cast Nylon 6 available as MC907 from Polymer Corporation, Reading, Pa.

Filler 160 is an elastomeric material that is cast in the space between core 142 and shell 150 and adhesively bonded to the inner surface of shell 150 and the outer surface of core 142. The filler material preferably has a durometer of about 30–60 Shore A, with a durometer of about 35–45 Shore A being especially preferred. Polyurethane sold by UNIROYAL under the mark VIBRATHANE 8011 is an especially preferred filler material. The compression/deflection characteristics of especially preferred fillers, as measured by ASTM 575-88 Method A, are as follows:

| % Compression | Stress (psi), +10% |
| --- | --- |
| 15 | 64 |
| 20 | 91 |
| 25 | 120 |
| 30 | 154 |
| 35 | 195 |
| 40 | 248 |

As shown in FIG. 14, rigid shafts 164 are mounted on or formed integrally with core 142 or roller 140. Bearings 166 are mounted on shafts 164 in proximity to but spaced from the edge of filler 160 and shell 150.

Having illustrated and described the principles of my invention with reference to several preferred embodiments, it should be apparent to those skilled in the art that my invention may be modified in arrangement and detail without departing from such principles. I claim as my invention all such embodiments as fall within the scope of the following claims.

I claim:

1. A dual roller apparatus for pressure fixing sheet material and reducing the dimensional distortion of sheet material processed therein, comprising:

a first elongate composite roller comprising a central core, a shell having an inner diameter greater than an outer diameter of said central core aligned concentrically with said core, said shell providing a shell pressure application surface, and an elastomeric filler disposed in the space between said core and said shell; and a second elongate roller having a pressure application surface aligned with said shell pressure application surface of said first composite roller to form a nip; and means for applying a load to at least one of said rollers to provide a fixing pressure to sheet material passing through the nip in excess of a threshold pressure which is sufficient to pressure fix the material, wherein said fixing pressure applied at a central portion of said nip is higher than said fixing pressure applied near terminal ends of said nip.

2. A dual roller apparatus according to claim 1, wherein the central core is non-cylindrical.

3. A dual roller apparatus according to claim 2, wherein a cross-sectional dimension of said central core is largest at its longitudinal midpoint and diminishes symmetrically from the midpoint toward each terminal end of said central core.

4. A dual roller apparatus according to claim 1, wherein said threshold pressure is about 3000 psi.

5. A dual roller apparatus according to claim 1, wherein said fixing pressure diminishes symmetrically from said central portion of said nip toward each terminal end of said nip.

6. A dual roller apparatus according to claim 1, wherein said fixing pressure applied at said central portion of said nip is at least about 5% greater than said fixing pressure applied near terminal ends of said nip.

7. A dual roller apparatus according to claim 6, wherein said fixing pressure applied at said central portion of nip is about 15% greater than said fixing pressure applied near terminal ends of said nip.

8. A dual roller apparatus according to claim 1, wherein said composite roller and said second roller are aligned on substantially parallel longitudinal axes.

* * * * *